(12) United States Patent
Ferrante do Amaral et al.

(10) Patent No.: US 9,785,812 B2
(45) Date of Patent: Oct. 10, 2017

(54) ENCLOSURE FOR AN OPTICAL DEVICE

(71) Applicant: Diebold, Incorporated, North Canton, OH (US)

(72) Inventors: Carlos Eduardo Ferrante do Amaral, North Canton, OH (US); Matheus Neto, Sao Paulo (BR); Ivan Aparecido da Silva, Sao Paulo (BR); Randall W. Jenkins, Orrville, OH (US); Marcelo Soares de Castro, Canton, OH (US); Gilson Goncalves dos Santos, Sao Paulo (BR); Don Douglas Jimison, Louisville, OH (US)

(73) Assignee: Diebold Nixdorf, Incorporated, North Canton, OH (US)

( * ) Notice: Subject to any disclaimer, the term of this patent is extended or adjusted under 35 U.S.C. 154(b) by 0 days.

(21) Appl. No.: 15/241,709

(22) Filed: Aug. 19, 2016

(65) Prior Publication Data

US 2017/0053148 A1    Feb. 23, 2017

Related U.S. Application Data

(60) Provisional application No. 62/207,205, filed on Aug. 19, 2015.

(51) Int. Cl.
*G06K 7/10* (2006.01)
*G07F 19/00* (2006.01)
(Continued)

(52) U.S. Cl.
CPC ....... *G06K 7/10831* (2013.01); *G07F 19/201* (2013.01); *G07F 19/205* (2013.01);
(Continued)

(58) Field of Classification Search
None
See application file for complete search history.

(56) References Cited

U.S. PATENT DOCUMENTS 5,510,612 A    4/1996    Scofield et al.
6,041,134 A    3/2000    Merjanian
(Continued)

FOREIGN PATENT DOCUMENTS

EP          2723153        4/2014
WO    WO 2012/056861      5/2012
WO    WO 2013/160246     10/2013

OTHER PUBLICATIONS

International Search Report and Written Opinion of corresponding PCT application No. PCT/US2016/047761.

*Primary Examiner* — Kristy A Haupt
(74) *Attorney, Agent, or Firm* — Black, McCuskey, Souers & Arbaugh, LPA

(57) ABSTRACT

In accordance with an example embodiment, there is disclosed herein, an apparatus, comprising a bezel, a cover, and a thermally conductive, electrically isolating material. The cover comprises top and side surfaces, a cavity for receiving an optical device, a first opening for the optical device to obtain an image, and a second opening for allowing an electrical conductor to be coupled with the optical device. The thermally conductive, electrically isolating, material, is shaped in accordance with the shape of the optical device. The bezel and the cover protect the optical device from discharge currents. The thermally conductive, electrically isolating, material provides electrical isolation of the optical device from the cover and conducts heat from the optical device to the top and side surfaces of the cover.

16 Claims, 5 Drawing Sheets

(51) Int. Cl.
*G07G 1/00* (2006.01)
*H01F 27/08* (2006.01)
*H05K 5/00* (2006.01)
*H05K 5/02* (2006.01)
*H05K 5/03* (2006.01)
*H05K 7/20* (2006.01)

(52) U.S. Cl.
CPC ........... *G07G 1/0018* (2013.01); *H01F 27/08* (2013.01); *H05K 5/0004* (2013.01); *H05K 5/0247* (2013.01); *H05K 5/03* (2013.01); *H05K 7/20409* (2013.01)

(56) References Cited

U.S. PATENT DOCUMENTS

| | | |
|---|---|---|
| 6,870,238 B2 | 3/2005 | Exposito et al. |
| 7,327,005 B2 | 2/2008 | Brechignac et al. |
| 7,379,119 B1 * | 5/2008 | Schuetz ........... G08B 13/19632 348/151 |
| 2003/0161593 A1 | 8/2003 | Stackhouse |
| 2006/0232663 A1 * | 10/2006 | Gandhi ............... H04L 12/5895 348/14.02 |
| 2007/0125864 A1 | 6/2007 | Hayakawa |
| 2012/0261306 A1 * | 10/2012 | Richardson ........... G06F 1/1626 206/778 |

* cited by examiner

ENCLOSURE FOR AN OPTICAL DEVICE

CROSS REFERENCE TO RELATED APPLICATIONS

This application claims the benefit under 35 U.S.C. §119 of U.S. Provisional Application No. 62/207,205 filed Aug. 19, 2015.

TECHNICAL FIELD

The present disclosure relates generally to protective enclosures, or housing, for optical devices that are electrically operated, such as, for example, image scanners.

BACKGROUND

Uses for optical devices are legion. For example, an automated banking machine (such as an automated transaction machine or "ATM") may employ one or more optical scanners for reading a barcode, such as a 2 dimensional barcode or QR code, obtaining images of items being deposited, and/or obtaining an image of a user operating the automated banking machine.

BRIEF DESCRIPTION OF THE DRAWINGS

The accompanying drawings incorporated herein and forming a part of the specification illustrate the example embodiments.

OVERVIEW OF EXAMPLE EMBODIMENTS

Figure 1:
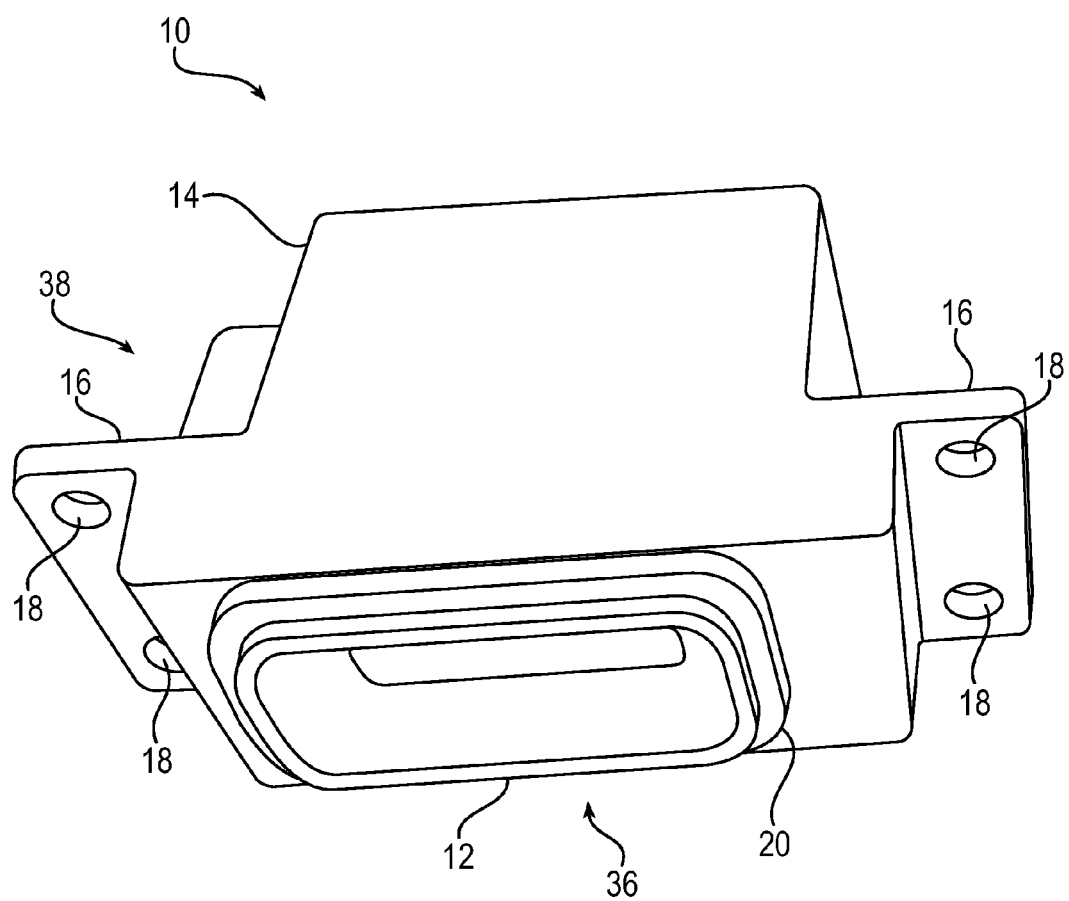
FIG. 1 is a perspective view of a front and top sides of an enclosure for an optical device according to an example embodiment.
Figure 2:
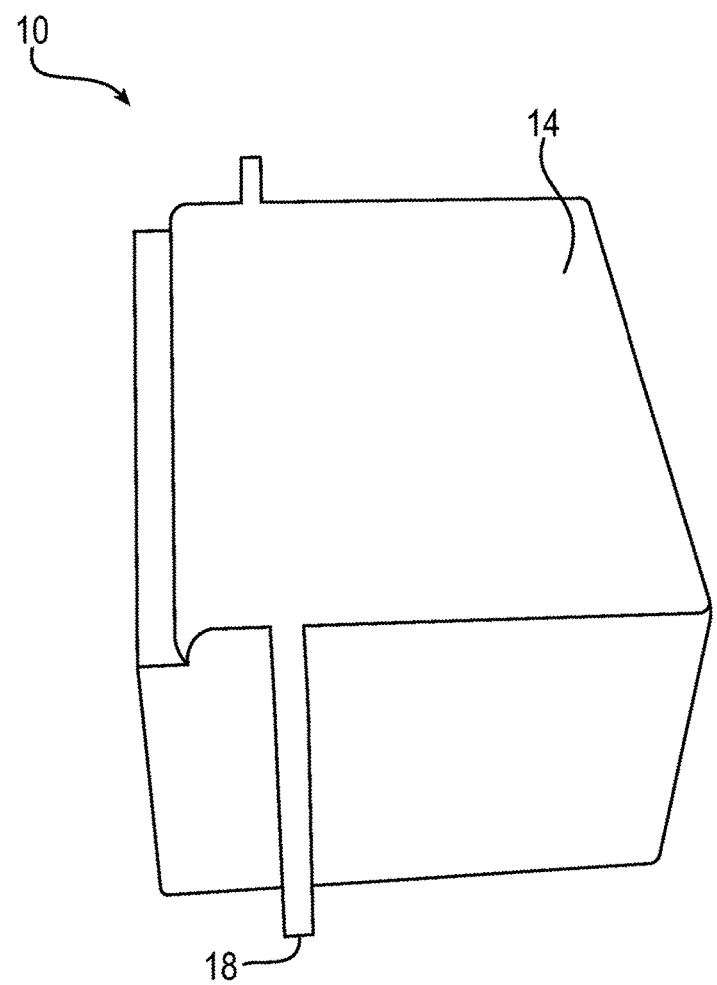
FIG. 2 is a perspective view of a side of the enclosure for an optical device illustrated in FIG. 1.
Figure 3:
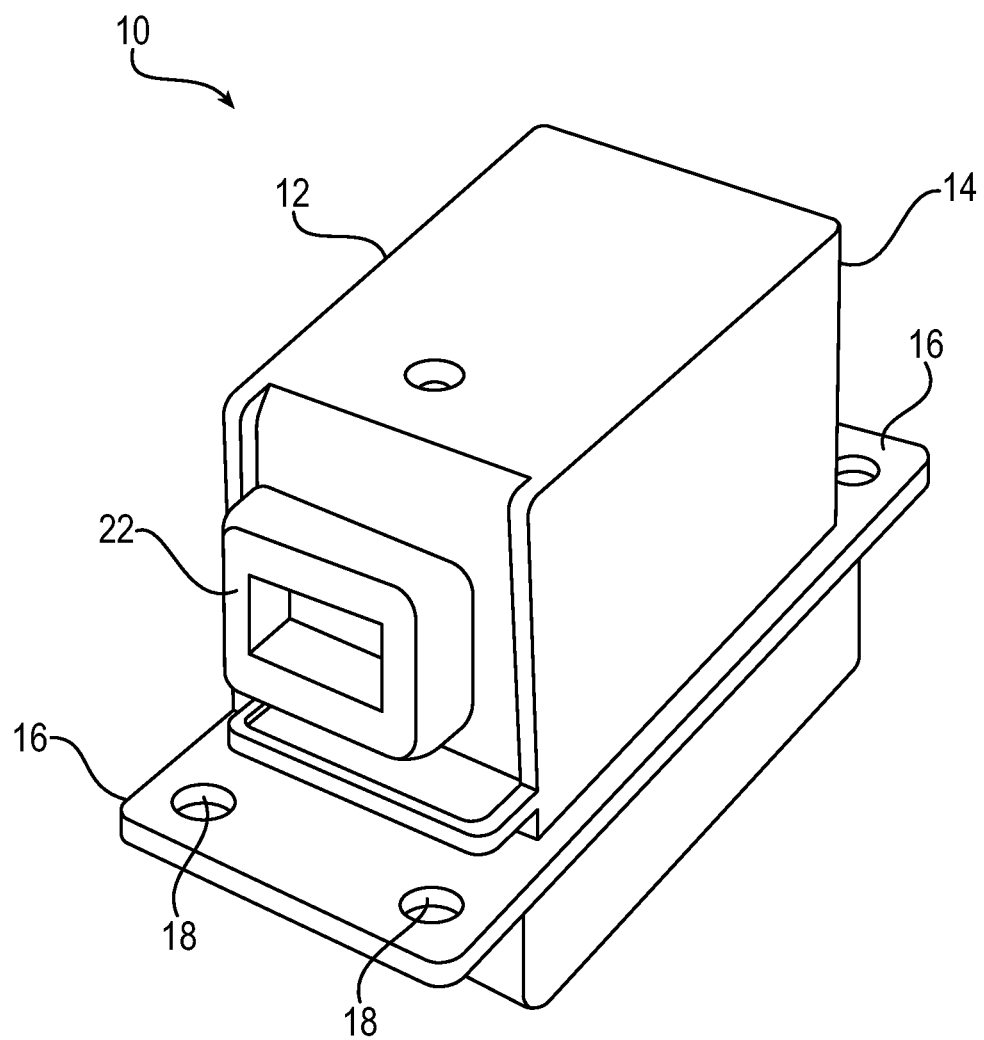
FIG. 3 is a perspective view of the rear of the enclosure for an optical device illustrated in FIG. 1.
Figure 4:
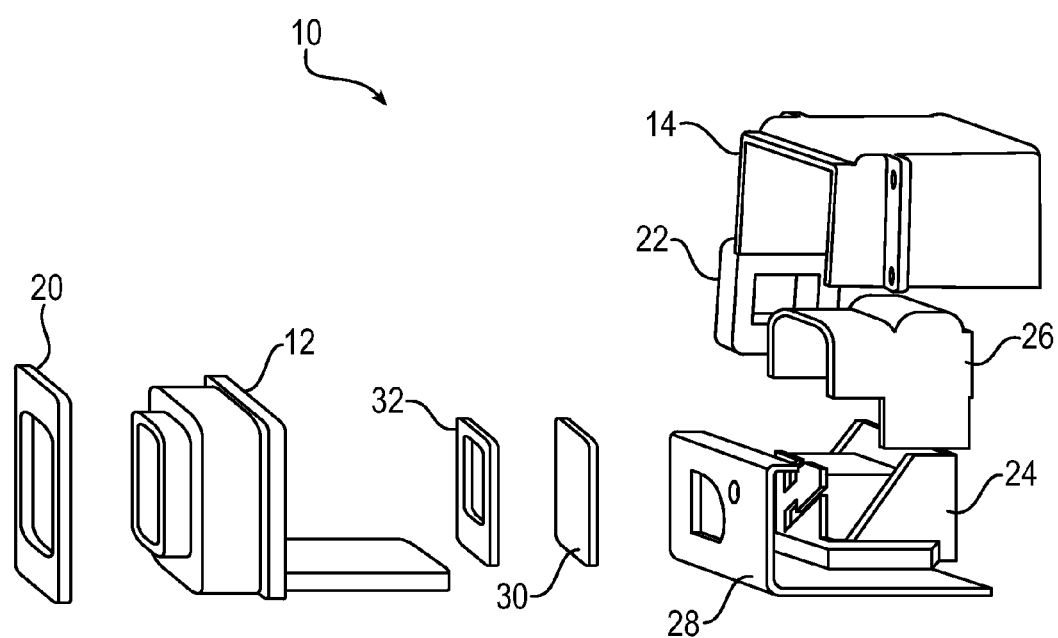
FIG. 4 is an exploded side view of the enclosure for an optical device illustrated in FIG. 1.
Figure 5:
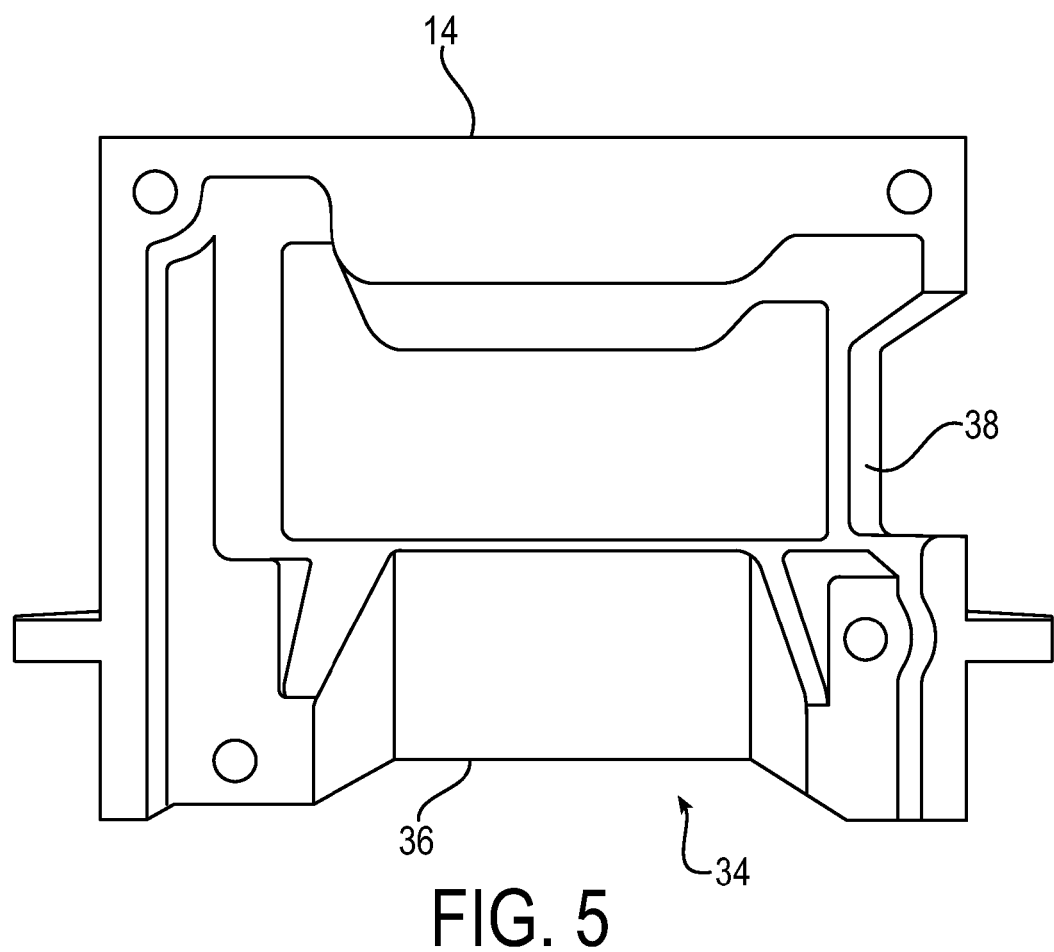
FIG. 5 is a perspective view illustrating the inner surface side of the cover for the optical device illustrated in FIG. 1.

The following presents a simplified overview of the example embodiments in order to provide a basic understanding of some aspects of the example embodiments. This overview is not an extensive overview of the example embodiments. It is intended to neither identify key or critical elements of the example embodiments nor delineate the scope of the appended claims. Its sole purpose is to present some concepts of the example embodiments in a simplified form as a prelude to the more detailed description that is presented later.

In accordance with an example embodiment, there is disclosed herein, an apparatus, comprising a bezel, a cover, and a thermally conductive, electrically isolating material. The cover comprises top and side surfaces, a cavity for receiving an optical device, a first opening for the optical device to obtain an image, and a second opening for allowing an electrical cable to be coupled with the optical device. The thermally conductive, electrically isolating, material, is shaped in accordance with the shape of the optical device. The bezel and the cover protect the optical device from discharge currents. The thermally conductive, electrically isolating, material provides electrical isolation of the optical device from the cover and conducts heat from the optical device to the top and side surfaces of the cover.

DESCRIPTION OF EXAMPLE EMBODIMENTS

This description provides examples not intended to limit the scope of the appended claims. The figures generally indicate the features of the examples, where it is understood and appreciated that like reference numerals are used to refer to like elements. Reference in the specification to "one embodiment" or "an embodiment" or "an example embodiment" means that a particular feature, structure, or characteristic described is included in at least one embodiment described herein and does not imply that the feature, structure, or characteristic is present in all embodiments described herein.

Referring to the figures, there are illustrated various views of an example embodiment of an enclosure 10 for an optical device 24. The enclosure 10 comprises a bezel 12 and a cover 14. In an example embodiment, the bezel 12 and cover 14 are constructed of a material that is a good electrical conductor, for example Aluminum (e.g., Aluminum 383 with sandblasting and Alodine 5200 as a treatment to protect against corrosion). The bezel 12 and cover 14 form a Faraday cage and provide electrical isolation for the optical device 24. A ground cable (not shown) may be coupled with the bezel 12, the cover 14 or both the bezel 12 and cover 14 to conduct currents in case of static discharge in the enclosure surface. The bezel 12 forms the bottom and front surfaces of the enclosure 10. The cover 14 forms the top, rear, left and right sides of the enclosure 10.

In an example embodiment, the cover 14 comprises fins 16 with mounting holes 18 to facilitate mounting the enclosure 10 on to an external device (not shown), such as, for example, an automated banking machine ("ATM"). Any suitable fastener may be employed to couple the enclosure 10 with the external device. In particular embodiments, a front (or bezel) gasket 20 may be employed to seal the enclosure 10 with the external device.

In an example embodiment, the cover has a cavity 34 shaped in accordance with the optical device 24. The cover 14 has two openings 36, 38. Opening 36 allows for the optical device to obtain an image. Opening 38 allows for an electrical connector, such as a cable, to be coupled with the optical device 24. This allows the optical device 24 to receiver power, and/or communicate electronically with an external device.

In an example embodiment, a cable gasket, or grommet 22 is employed for sealing the enclosure 10 from water and protecting the electrical interface inside the enclosure. For example, the optical device 24 may employ a micro USB (Universal Serial Bus) interface (not shown) that is coupled with a cable for power and/or data communications with an external device (not shown). The grommet 22 will protect the cable and micro USB connector from electrical discharges on the surface of the bezel 12 and/or cover 14. In an example embodiment, the grommet 22 is made from a resin such as TPE Santoprene 101-55.

In an example embodiment, a thermally conductive, electrically isolating, material 26 that is shaped in accordance with the shape of the optical device 24, electrically isolates the optical device 24 from the cover 14. The thermally conductive, electrically isolating, material 26 conducts heat from the optical device 24 to the cover 14 allowing for the heat from the optical device to dissipate in the air surrounding the enclosure 10. An example of a thermally conductive, electrically isolating material, suitable for an example embodiment is a silicon-free polymer known as GAP PAD 2200SF, available from Bergquist Company, 18930 West 78$^{th}$ Street, Chanhassen, Minn. 53313, www.bergquistcompany.com.

In an example embodiment, the optical device 24 is a two dimensional bar code scanner. However, as those skilled in the art can readily appreciate, other embodiments may incorporate any suitable type of optical device, such as, for example, check scanners, identification card scanners, etc. As those skilled in the art can readily appreciate, in particular embodiments, the enclosure 10 may be employed with other types of scanners such as an infra red scanner.

In an example embodiment, the enclosure 10 includes a cover gasket 28 that seals the contacts between the bezel 12 and the cover 14. This can prevent moisture from entering the interior of the enclosure 10. In particular embodiments, the cover gasket 28 may also provide electrical isolation between the bezel 12 and the optical device 24.

In an example embodiment, the enclosure 10 includes a transparent optical window 30 and a window gasket 32 for sealing the window 30 against the bezel 12. This can prevent moisture from entering the enclosure 10. A suitable material for a transparent optical window that offers low optical absorbance and high electrical resistance to isolate internal circuits is ADC (Allyl Diglycol Carbonate) 200 (CR-39 or "Columbia Resin #39") Plastic. A suitable material for the window gasket is EPDM (ethylene propylene diene monomer (M-class) rubber) dense rubber, 50 durometer In particular embodiments, the cover gasket 28 provides increased pressure to the optical window 30 to provide increased resistance against strong winds and/or precipitation such as rain or snow.

Aspects of the aforementioned example embodiments include thermal performance at temperatures up to 60° C., electrical isolation and protection against static discharge, and water resistance. This can allow for the optical device 24 to be employed in a wide variety of environmental conditions.

Described above are example embodiments. It is, of course, not possible to describe every conceivable combination of components or methodologies, but one of ordinary skill in the art will recognize that many further combinations and permutations of the example embodiments are possible. Accordingly, this application is intended to embrace all such alterations, modifications and variations that fall within the spirit and scope of the appended claims interpreted in accordance with the breadth to which they are fairly, legally and equitably entitled.

The invention claimed is:

1. An apparatus, comprising:
a L shaped bezel;
a cover that comprises a cavity for receiving an optical device, a first opening for the optical device to obtain an image, and a second opening for allowing an electrical cable to be coupled with the optical device;
a L shaped cover gasket coupled with the L shaped bezel; and
a thermally conductive, electrically isolating, material, shaped in accordance with a shape of the optical device;
wherein the L shaped bezel engages the cover to form an enclosure, the bezel forming the bottom and front surface of the enclose, and the cover forming the top, left, right, and rear sides of the enclosure;
wherein the L shaped cover gasket seals the contacts between the L shaped bezel and the cover, and the L shaped cover gasket provides electrical isolation between the bezel and the optical device;
wherein the bezel and the cover protect the optical device from discharge currents; and
wherein the thermally conductive, electrically isolating, material provides electrical isolation of the optical device from the cover and conducts heat from the optical device to the top and side surfaces of the cover.

2. The apparatus set forth in claim 1, further comprising the optical device.

3. The apparatus set forth in claim 2, wherein the optical device is a two dimensional barcode scanner.

4. The apparatus set forth in claim 1, further comprising:
an optical window located between the optical device and the bezel; and
a window gasket that seals the optical window with the bezel.

5. The apparatus set forth in claim 1, wherein the cover allows electrical discharge currents to flow to a surface ground cable.

6. The apparatus set forth in claim 1, wherein the cover dissipates heat from the optical device conducted by the thermally conductive, electrically isolating, material to external air.

7. The apparatus set forth in claim 1, further comprising:
a grommet located at the second opening;
wherein the second opening is operable to receive an electrical conductor that couples the optical device with an external device; and
wherein the grommet protects the electrical conductor from electrical discharges.

8. The apparatus set forth in claim 1, further comprising a bezel gasket operable to form a seal between the apparatus and an external device.

9. An apparatus, comprising:
a L shaped bezel;
a cover;
wherein the bezel and cover form an enclosure, the bezel forming front and bottom surfaces of the enclosure, and the cover forming the top, left, right and rear surfaces of the enclosure;
a L shaped cover gasket coupled with the L shaped bezel, the cover gasket providing a seal between the bezel and the cover, and the cover gasket provides electrical isolation between the bezel and an optical device within the enclosure;
the front surface of the enclosure having an opening;
an optical window;
a window gasket disposed between the optical window and the front surface of the bezel, the optical window is disposed between the window gasket and the cover gasket;
the cover having an opening at one of a group consisting of the right, left, and rear surface for receiving a cable;
a grommet providing a seal between the one of the group consisting of the right, left, and rear surface and the cable, the grommet electrically isolating the cable from the one of the group consisting of the right, left, and rear surface and protecting the cable from electrical discharges from the cover; and
a thermally conductive, electrically isolating, material, shaped in accordance with the shape of the optical device, the thermally conductive, electrically isolating, material provides electrical isolation of the optical device from the cover and conducts heat from the optical device to the top and side surfaces of the cover;

wherein the enclosure forms a Faraday cage and electrical isolates the optical device within the enclosure and protects the optical device from electric discharges on the bezel and the cover.

10. The apparatus set forth in claim 9, further comprising the optical device.

11. The apparatus set forth in claim 10, wherein the optical device is a two dimensional barcode scanner.

12. The apparatus set forth in claim 9, wherein the cover dissipates heat from the optical device conducted by the thermally conductive, electrically isolating, material to external air.

13. The apparatus set forth in claim 10, wherein the bezel and cover are constructed from an electrically conductive material.

14. The apparatus set forth in claim 11, wherein the cover gasket is positioned to provide increased pressure to the optical window to provide increased resistance against wind and precipitation.

15. The apparatus set forth in claim 12, the cover comprises fins with mounting holes to facilitate mounting of the enclosure on to an external device, the fins attached to the right and left sides of the enclosure.

16. The apparatus set forth in claim 13, further comprising a front gasket that seals the enclosure with an external device.

\* \* \* \* \*